(12) United States Patent
Lealman

(10) Patent No.: US 7,715,090 B2
(45) Date of Patent: May 11, 2010

(54) LASER SOURCE

(75) Inventor: Ian Lealman, Ipswich (GB)

(73) Assignee: The Centre For Integrated Photonics Limited, Ipswich (GB)

( * ) Notice: Subject to any disclaimer, the term of this patent is extended or adjusted under 35 U.S.C. 154(b) by 0 days.

(21) Appl. No.: 11/815,334

(22) PCT Filed: Feb. 2, 2006

(86) PCT No.: PCT/GB2006/000357

§ 371 (c)(1),
(2), (4) Date: Apr. 8, 2008

(87) PCT Pub. No.: WO2006/082408

PCT Pub. Date: Aug. 10, 2006

(65) Prior Publication Data

US 2008/0316589 A1   Dec. 25, 2008

(30) Foreign Application Priority Data

Feb. 2, 2005 (GB) .................. 0502109.2

(51) Int. Cl.
G02F 1/35 (2006.01)
G02F 2/02 (2006.01)
G02B 6/00 (2006.01)

(52) U.S. Cl. .................. 359/328; 385/37; 385/122

(58) Field of Classification Search .................. 385/10, 385/14, 37, 122, 129–132; 359/326–332
See application file for complete search history.

(56) References Cited

U.S. PATENT DOCUMENTS

| 5,379,309 A | | 1/1995 | Logan | |
|---|---|---|---|---|
| 5,652,817 A | * | 7/1997 | Brinkman et al. | 385/37 |
| 5,710,651 A | | 1/1998 | Logan | |
| 5,838,473 A | | 11/1998 | Wake | |
| 6,434,294 B1 | * | 8/2002 | Gallo | 385/27 |
| 7,174,070 B2 | * | 2/2007 | Kim et al. | 385/37 |

FOREIGN PATENT DOCUMENTS

| EP | 1343232 | | 9/2003 |
|---|---|---|---|
| JP | 61191093 | | 8/1986 |
| JP | 07015092 | | 1/1995 |
| JP | 2000012958 A | * | 1/2000 |

OTHER PUBLICATIONS

Search report for corresponding application No. PCT/GB2006/000357 dated Jul. 28, 2006.

* cited by examiner

*Primary Examiner*—Daniel Petkovsek
(74) *Attorney, Agent, or Firm*—Renner, Otto, Boisselle & Sklar, LLP

(57) ABSTRACT

An optical device for generating a beat frequency between two optical wavelengths includes two waveguides (2a, 2b) of different width and a grating layer (4) that is common to both wave guides.

9 Claims, 2 Drawing Sheets

LASER SOURCE

This application is a national phase of International Application No. PCT/GB2006/000357 filed Feb. 2, 2006 and published in the English language.

FIELD OF THE INVENTION

This invention relates to an integrated optical device, and in particular to an optical device suitable for the generation of low phase noise RF (radio frequency) and THz (terahertz) signals by the beating of two laser modes of different wavelength.

BACKGROUND TO THE INVENTION

It is known that beating the modes of two single frequency lasers of different wavelength on a fast photodiode will result in the generation of an RF beat frequency. The frequency of the beat signal is defined by the separation in wavelength of the light generated by the two lasers. Such an approach has been used for the generation of RF carriers for optical communications. In much of the prior art this is accomplished by the use of two or more discrete devices as disclosed in U.S. Pat. No. 5,710,651 (Logan), U.S. Pat. No. 5,379,309 (Logan) and U.S. Pat. No. 5,838,473 (Wake). This approach, while feasible, requires the accurate control of two discrete devices, which increases the complexity and therefore the cost of the required control. In Electronics Letters, 1995, Vol. 31 No. 5 pp 364-365 (C. R. Lima, D. Wake and P. A. Davies), the use of a dual frequency distributed feedback (DFB) laser is proposed. In this approach both wavelengths are generated within one device by the use of lasing on either side of the stop band of a DFB. This approach limits the frequency difference to around 60 GHz due to the limitations of the strength of grating that may be employed.

It is also recognised that the beating of two wavelengths from different or the same semiconductor laser places limitations on the phase noise of the beat frequency. U.S. Pat. No. 5,379,309 (Logan) proposes overcoming this by the use of an additional mode locked laser. While Lima, Wake and Davies achieve this by providing an electrical drive signal at a subharmonic of the beat frequency.

SUMMARY OF THE INVENTION

Accordingly, this invention provides an optical device for generating a beat frequency between two optical wavelengths, the device comprising two waveguides of different width and a grating layer that is common to both waveguides.

The two waveguides may be arranged in parallel. The two waveguides may have a constant width along their length. The spacing between the waveguides may be sufficiently small that their mode fields interact along the length of the waveguides to maintain a phase relationship between the modes. The spacing between the waveguides may be between 1 and 3 μm.

In general each waveguide includes an active region (gain section). The active region may be a multiple quantum well (MQW) active region.

In one embodiment, the common grating is located over the active region of the waveguides. Such an arrangement allows the device to be formed as a DFB laser device.

In an alternative embodiment, the common grating is spaced from the active region of the waveguides. Such an arrangement allows the device to be formed as a DBR laser device.

The waveguides may be linked by a mode combiner, for example a y-junction.

Viewed from a broad aspect, the invention provides a device for generating RF or THz beat frequencies where the device employs a common grating and two waveguides of separate width to generate two modes of distinct wavelength.

The waveguides may be in close proximity so that the mode fields interact along the entire length of the device to maintain a phase relationship between the modes. The devices may have a buried heterostructure geometry and the waveguides may be separated by between 1 and 3 μm.

In one embodiment, the modes may be linked using a mode combiner. In one embodiment the gain section may be distinct from the common grating so that the linked devices are DBR (distributed Bragg reflector) lasers.

BRIEF DESCRIPTION OF THE DRAWINGS

An embodiment of the invention will now be described by way of example only and with reference to the accompanying drawings, in which.

DETAILED DESCRIPTION OF EMBODIMENTS OF THE INVENTION

Figure 1:
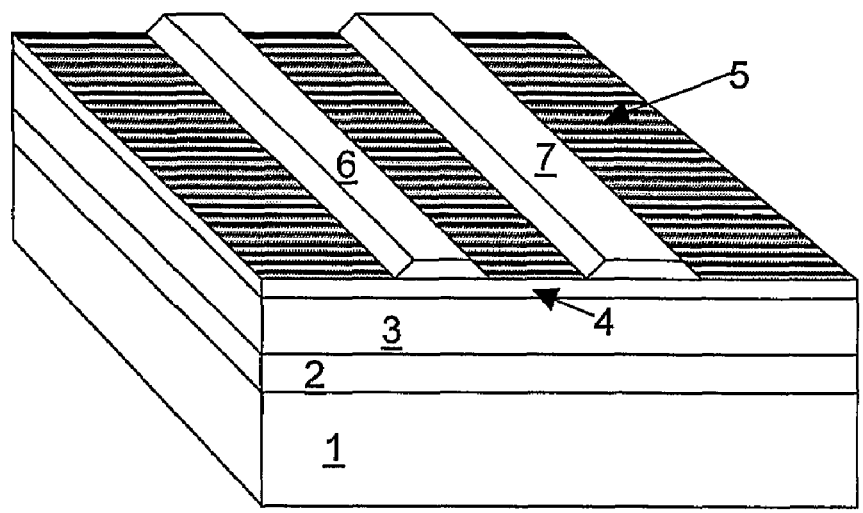
FIG. 1 is a schematic view of mask layers showing how two waveguides can be formed using a common grating according to an embodiment of the invention.

A monolithic integrated optical device (laser source) for the generation of RF and THz frequencies is disclosed. The device employs a grating or gratings of a single period and a pair of waveguides of substantially different width, as shown in FIG. 1, to allow the generation of two optical wavelengths separated by an amount that will permit the generation of RF or THz frequencies when the light from the device is mixed on a fast photodiode or other mixing device. The waveguides are also intimately linked to reduce the phase noise of the device.

The aim of this device is to simplify the control of the beat frequency by using a twin guide DFB or DBR (distributed Bragg reflector) in which the laser stripes are arranged such that the modes of the device can interact along the cavity. This allows a wider range of frequencies to be addressed from GHz to THz. In addition such a device is relatively simple to integrate and can be fabricated using a common grating period if the width of the waveguides are substantially different since changing the relative widths of the waveguides will provide an offset in the modal index for each guide. This shift in modal index will allow a common grating of fixed period to stimulate each laser guide to oscillate at a different wavelength.

Figure 2:
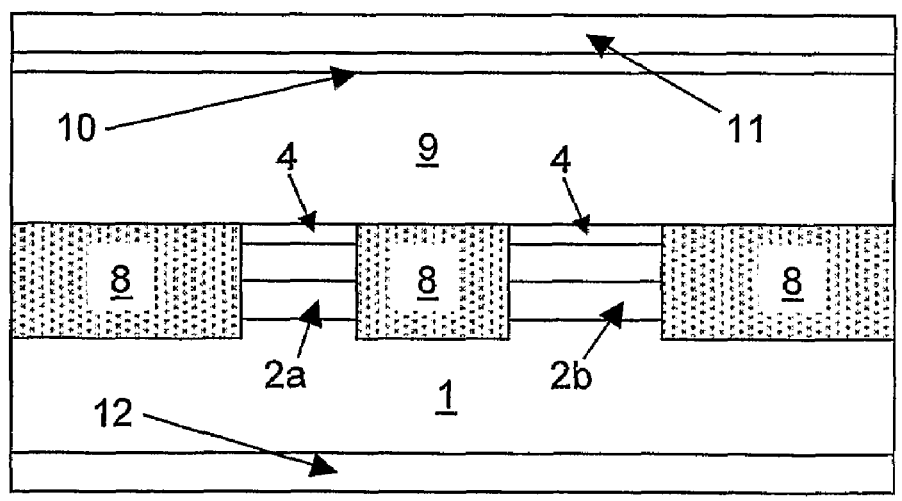
FIG. 2 is a cross-section of overgrown waveguide as formed if a device according to an embodiment of the invention is configured as a buried heterostructure device.
Figure 3:
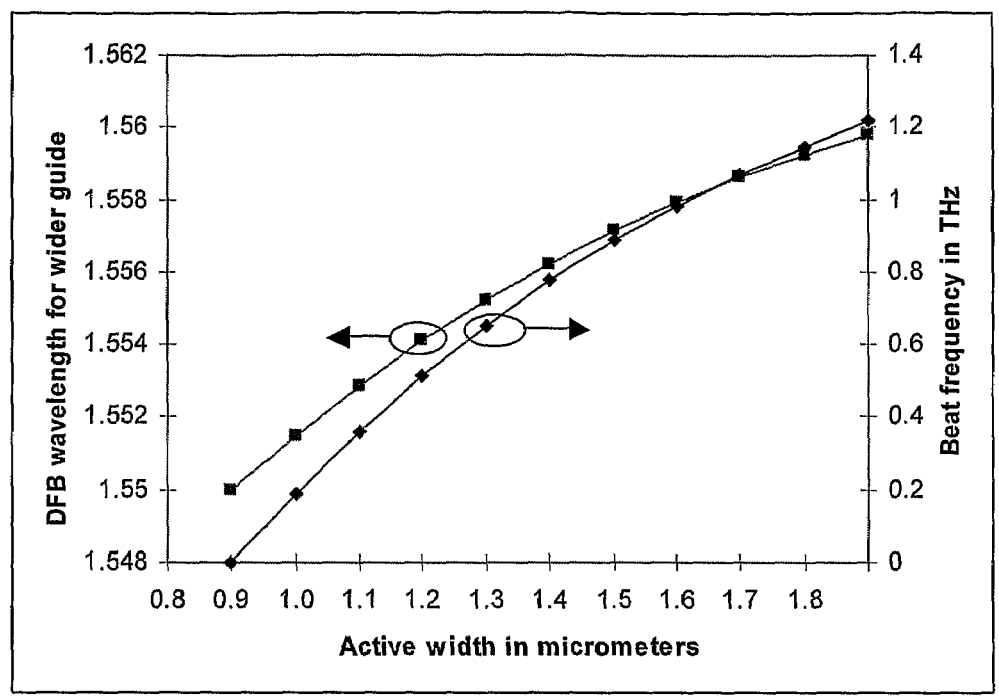
FIG. 3 is a chart illustrating the variation of wavelength difference and beat frequency between the stripes of the two DFB guides in a device according to an embodiment of the invention.

In the first embodiment, shown in FIGS. 1 and 2, two waveguides 2a, 2b of different widths are fabricated along a common grating 4 to form a pair of DFB lasers. By altering the widths of the two waveguides 2a, 2b it is possible to generate a difference in wavelength of the two devices of around 6 to 8 nm or 0.75 THz to 1 THz, as illustrated by FIG. 3. If the guides are kept in close proximity, typically 1-3 μm for a Buried Heterostructure laser, a device in which the modes interact to generate cavity supermodes can be realised, as shown in FIGS. 1 and 2. This produces a device that offers reduced phase noise since the cavity phase of both laser modes is intimately linked.

There are a number of possible configurations or embodiments of such a device which are described in detail below.

A device according to a first embodiment of the invention is fabricated as follows. On an n-type InP substrate 1, an n-type buffer layer (not shown) of InP having a thickness of 1-2 μm, MQW (multiple quantum well) active layer 2 consisting of a plurality of InGaAsP wells and InGaAsP barriers, a p-type InP spacer 3 and InGaAsP grating layer 4 are grown in the named order using metal organic vapour phase epitaxy (MOVPE). A first or second order grating 5 is defined in the grating layer, the grating being formed by E-beam or another appropriate technique followed by an etching step. This grating 5 is then masked using a layer of dielectric such as silica which is then defined by photolithography into stripes 6 and 7 of different widths, the stripes being separated by around 2 to 3 μm, as shown in FIG. 1. These masks are then used to allow two mesas to be etched and regrown by MOVPE to form a buried structure where the active stripes 2a and 2b are of different widths, as shown in FIG. 2.

To improve current injection, the region between the stripes 2a, 2b and to the sides of them is filled with InP current blocking layers 8. The current blocking layers 8 could be either a reverse biased p-n InP or semi-insulating structure using Fe or some other dopant. The mesas are over-clad with a layer 9 p-type InP and a highly p-doped InGaAs contact layer 10. Contact is made to this structure using n and p side metal layers 11 and 12, respectively. The metal layers comprising of Ti and Au or other combinations that will provide a low resistance contact.

In a DFB laser the wavelength of oscillation of the device is determined by the equation:

$$\Lambda = \lambda_b / 2 * n_{eff}$$

where, $\Lambda$ is the grating period of a first order grating, $\lambda_b$ is the wavelength of oscillation and $n_{eff}$ is the index of the guided mode of the waveguide at the Bragg wavelength. It is therefore possible to alter the wavelength of operation of the stripes 2a, 2b by altering the index of the guided mode.

It is well known that the modal index is directly related to the waveguide geometry including the thicknesses, widths and compositions of the layers. The effective modal index for a range of device widths calculated using the commercial software FIMMWAVE, available from Photon Design of Oxford, UK, is shown in Table 1 for a typical buried heterostructure (BH) DFB laser design using a typical eight-well MQW active layer and loss-coupled grating at a wavelength of 1,550 nm. These values can be used to calculate an approximate value for the wavelength separation and therefore beat frequency that would be generated by mixing said wavelengths on a fast photodiode. In this example, a fixed grating period of 0.2435 μm is chosen to give a wavelength of operation of 1.55 μm for the narrower stripe 6. The beat frequency is obtained between a narrower guide 6 of fixed width 0.8 μm and a wider guide 7 whose width is increased from 0.8 μm to 1.8 μm. FIG. 3 is a chart illustrating that the wavelength difference and beat frequency between the stripes of the two DFB guides in a device according to an embodiment of the invention varies with the width difference between the stripes for a fixed grating pitch.

TABLE 1

| Active width (in μm) | TE0 modal index | Wavelength (in μm) | Beat frequency (in THz) |
|---|---|---|---|
| 0.8 | 3.183096 | 1.5500 | 0.00 |
| 0.9 | 3.186138 | 1.5515 | 0.18 |
| 1.0 | 3.188965 | 1.5529 | 0.36 |
| 1.1 | 3.191534 | 1.5541 | 0.51 |
| 1.2 | 3.193839 | 1.5552 | 0.65 |
| 1.3 | 3.195897 | 1.5562 | 0.78 |
| 1.4 | 3.197728 | 1.5571 | 0.89 |
| 1.5 | 3.199359 | 1.5579 | 0.98 |
| 1.6 | 3.200811 | 1.5586 | 1.07 |
| 1.7 | 3.202108 | 1.5593 | 1.15 |
| 1.8 | 3.203268 | 1.5598 | 1.22 |

It should be noted that since the two guided modes are at different wavelengths an exact treatment would require the dispersion of the material indices in the two guides to be accounted for. However, this would lead to only a small perturbation from the results shown and as such can be neglected.

In this first embodiment, the waveguides 2a, 2b are maintained in close proximity to minimise the variation between them. The need to have the waveguides in very close proximity only permits the use of a single contact above the device. As a result, in this embodiment, it may not be possible to pump the active stripes to different amounts, which may reduce the ability to optimise the output power of each stripe or the wavelength difference between them.

Figure 4:
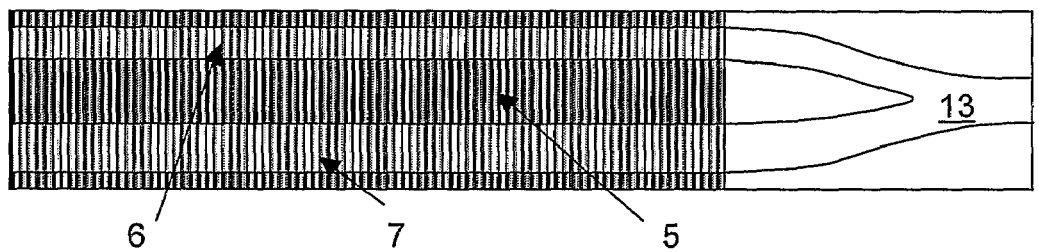
FIG. 4 is a plan view of a second embodiment of the invention.

FIG. 4 shows a plan view of a second embodiment of the invention in which the stripes of the DFB laser are linked using an active or passive y-junction to ease the constraint on the requirement to have both waveguides in very close proximity and to allow separate contact to be made to each DFB stripe 6, 7 if required. Thus, the second embodiment overcomes the limitation of the first embodiment by the use of a separate mode combining section. The mode combining region could be a passive or active y-junction, a common gain section 13, as shown in FIG. 4, or other structure designed to perform the same function. Such a configuration allows the two stripes 6, 7 to be separated further so that separate contacts can be placed over each mesa in region 5 while the inclusion of the mode combiner 13 maintains the phase relationship between the modes. This embodiment also permits the wavelength of each stripe to be tuned over a range of around 1 nm by altering the gain current applied. This tuneability will improve device yield since current control could be used to tune the beat frequency to overcome variations in absolute guide widths caused by fluctuations due to process variation.

Figure 5:
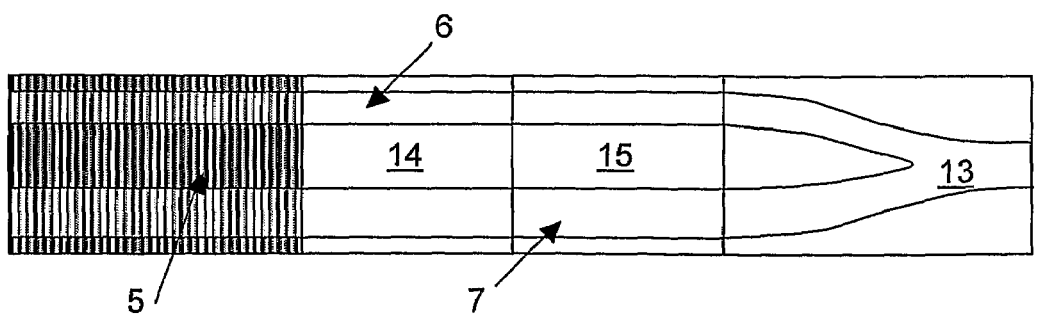
FIG. 5 shows a third embodiment of the invention in which DBR lasers are linked using an active or passive Y-junction or other waveguide coupling device.

In the second embodiment the frequency tuneability would be limited to 1-2 nm, therefore a third embodiment is proposed in which the DFB lasers are replaced by wavelength tuneable lasers such as distributed Bragg reflector (DBR) lasers, as shown in FIG. 5, or other more widely tuneable lasers. It is well known that such devices can be tuned over a range of around 8 nm by the application of current to the grating section 5. The two waveguides 6 and 7 of the device pass through separately contacted grating regions 5, phase control sections 14 and active gain sections 15 before combining in an active or passive y-junction section 13.

In the third embodiment, the guide widths in the two lasers are chosen to give wavelengths spaced by around 8 nm or 1 THz when both grating sections are unbiased. Applying a tuning current to the wider stripe 7, which has the longer wavelength of operation allows tuning from a beat frequency of around 1 THz to DC, while leaving the grating section of the wider stripe 7 unbiased and applying a current to the narrower stripe allows the device to be tuned from 1 THz to 2 THz.

In summary, an optical device for generating a beat frequency between two optical wavelengths includes two waveguides 2a, 2b of different width and a grating layer 4 that is common to both waveguides.

The invention claimed is:

1. An optical device for generating a beat frequency between two optical wavelengths, the device comprising two waveguides of different widths when viewed in a cross-section orthogonal to the longitudinal direction of the waveguides and a grating layer of fixed period that is common to both waveguides.

2. An optical device as claimed in claim 1, wherein the two waveguides are arranged in parallel.

3. A device as claimed in claim 2, wherein the spacing between the waveguides is sufficiently small that their mode fields interact along the length of the waveguides to maintain a phase relationship between the modes.

4. A device as claimed in claim 3, wherein the spacing between the waveguides is between 1 and 3 µm.

5. An optical device as claimed in claim 1, wherein each waveguide includes an active region.

6. An optical device as claimed in claim 5, wherein the active region is a multiple quantum well (MQW) active region.

7. An optical device as claimed in claim 5, wherein the common grating is located over the active region of the waveguides.

8. An optical device as claimed in claim 5, wherein the common grating is spaced from the active region of the waveguides.

9. An optical device as claimed in claim 1, wherein the waveguides are linked by a mode combiner.

* * * * *